US008757575B2

(12) United States Patent
Lin et al.

(10) Patent No.: US 8,757,575 B2
(45) Date of Patent: Jun. 24, 2014

(54) FIXING DEVICE FOR CIRCUIT BOARD

(75) Inventors: Chieh-Hsiang Lin, Tu-Cheng (TW); Wen-Tang Peng, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 420 days.

(21) Appl. No.: 13/118,568

(22) Filed: May 30, 2011

(65) Prior Publication Data

US 2012/0168584 A1  Jul. 5, 2012

(30) Foreign Application Priority Data

Dec. 29, 2010  (TW) .............................. 99146733 A

(51) Int. Cl.
*A47B 91/00* (2006.01)
(52) U.S. Cl.
USPC ....................... 248/346.03; 361/804; 411/389
(58) Field of Classification Search
USPC ............ 248/346.01, 346.03, 346.5, 507, 508; 361/803, 804, 807; 411/180, 389, 546
See application file for complete search history.

(56) References Cited

U.S. PATENT DOCUMENTS

| 3,596,138 | A | * | 7/1971 | Lehrfeld | 361/785 |
| 4,875,140 | A | * | 10/1989 | Delpech et al. | 361/789 |
| 5,956,835 | A | * | 9/1999 | Aksu | 29/468 |
| 6,280,202 | B1 | * | 8/2001 | Alden et al. | 439/66 |
| 6,347,042 | B1 | * | 2/2002 | White | 361/784 |
| 6,456,506 | B1 | * | 9/2002 | Lin | 361/816 |
| 6,543,098 | B2 | * | 4/2003 | Meyer et al. | 24/289 |
| 7,613,012 | B2 | * | 11/2009 | Hung et al. | 361/809 |
| 7,990,722 | B2 | * | 8/2011 | Cao et al. | 361/721 |
| 8,189,347 | B2 | * | 5/2012 | Mukouyama | 361/804 |

\* cited by examiner

*Primary Examiner* — Gwendolyn Baxter
(74) *Attorney, Agent, or Firm* — Novak Druce Connolly Bove + Quigg LLP

(57) ABSTRACT

A fixing device for circuit boards with different thickness includes a base board, a number of posts, and a number of fasteners extending through the circuit board and engaging with the posts. A number of fixing holes are defined in the base board. Each post includes a first threaded portion and a second threaded portion selectively screwed in the corresponding fixing holes of the base board. The length of the second threaded portion is different from the length of the first threaded portion. The circuit board is to be supported on a distal end of one of the first and second threaded portions that is not to be screwed in the fixing hole.

9 Claims, 6 Drawing Sheets

FIXING DEVICE FOR CIRCUIT BOARD

CROSS-REFERENCE OF RELATED APPLICATIONS

Relevant subject matter is disclosed in two pending U.S. patent applications, both titled with "FIXING DEVICE FOR CIRCUIT BOARD", respectively filed on May 25, 2011, with the application Ser. No. 13/115,121, and filed on May 27, 2011, with the application Ser. No. 13/117,140, which are assigned to the same assignee as this patent application.

BACKGROUND

1. Technical Field

The present disclosure relates to an adjustable device for fixing a circuit board.

2. Description of Related Art

A circuit board is fixed to a computer chassis through a number of supporting posts. When there is a need to install another circuit board having a different thickness, the supporting posts should be replaced with others. However, in most cases, the supporting posts are an integral part of the chassis, which makes replacement very difficult, if not impossible.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
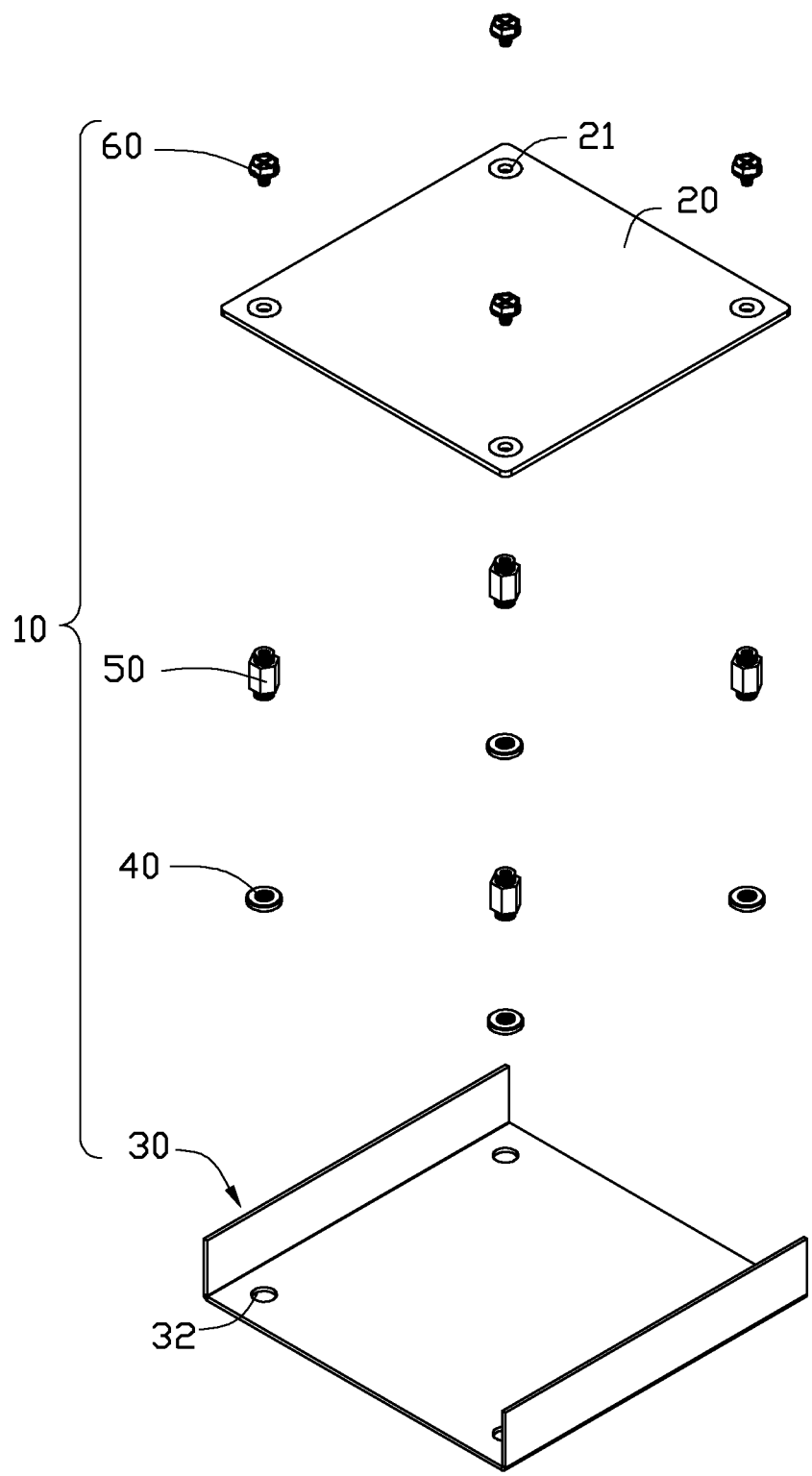
FIG. 1 is an exploded, isometric view of an exemplary embodiment of a fixing device, together with a circuit board; the fixing device includes a plurality of nuts.
Figure 2:
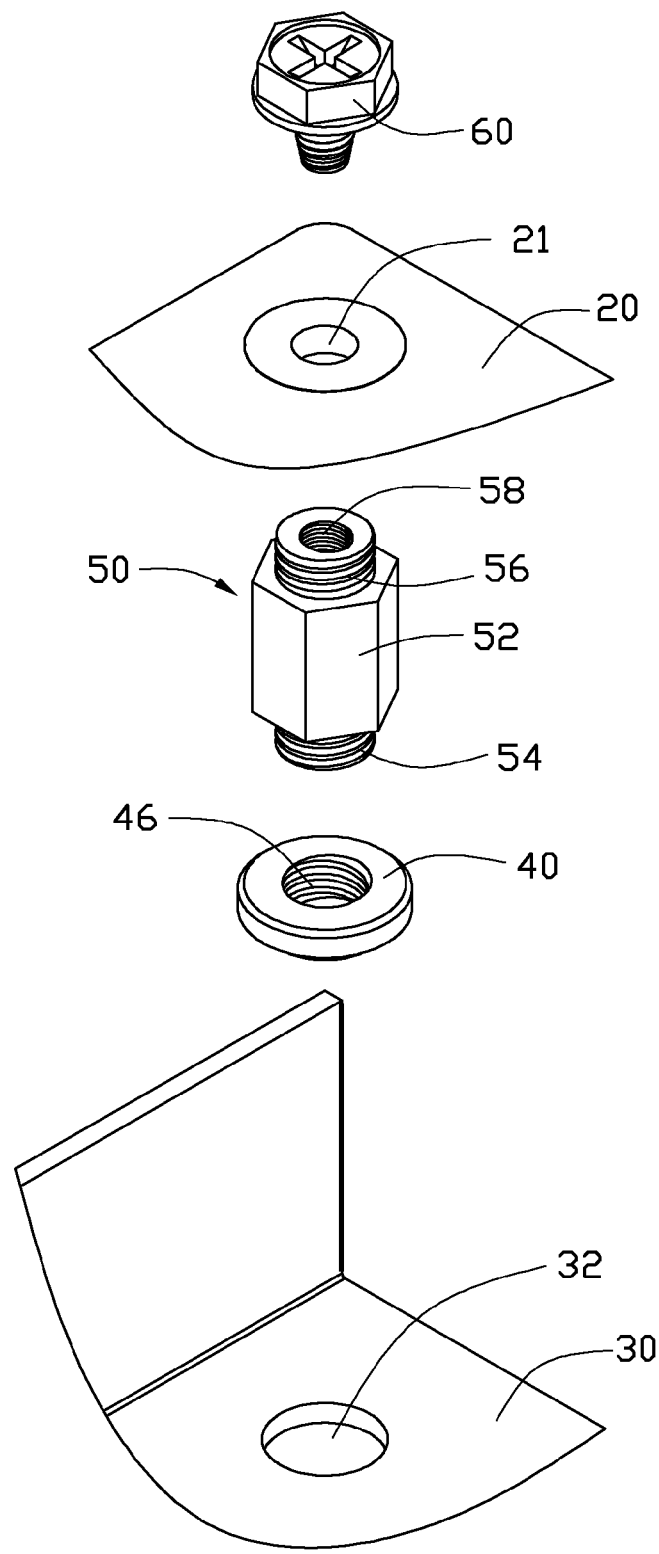
FIG. 2 is a partial, enlarged view of FIG. 1.

Referring to FIGS. 1 and 2, an exemplary embodiment of a fixing device 10 for fixing circuit boards having different thicknesses includes a base board 30, a plurality of nuts 40, a plurality of posts 50, and a plurality of fasteners 60. In this embodiment, the fasteners 60 are screws.

In one embodiment, the base board 30 is a sidewall of a computer enclosure, or a board fixed to the sidewall of the computer enclosure. A plurality of fixing holes 32 is defined in the base board 30.

Each post 50 includes a main body 52 with a hexagon-shaped cross section, and a first threaded portion 54 and a second threaded portion 56 extending from opposite ends of the main body 52. Threads are formed on the circumferences of the first and second threaded portions 54 and 56. The post 50 axially defines a threaded hole 58 extending through the first and second threaded portions 54 and 56. The length of the second threaded portion 56 is greater than the length of the first threaded portion 54.

Figure 3:
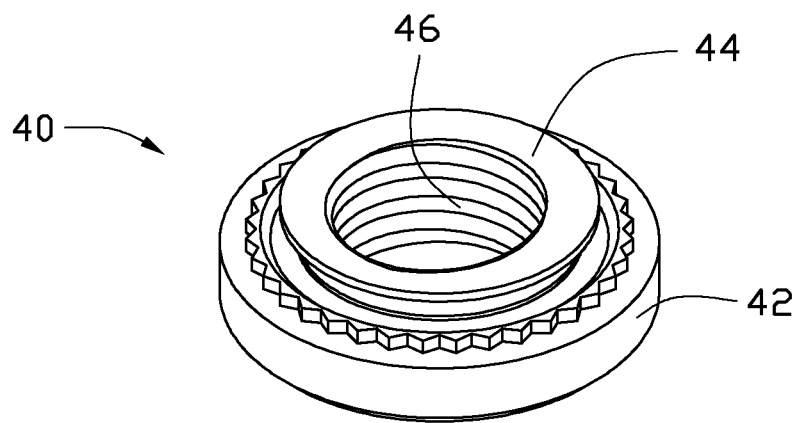
FIG. 3 is an enlarged, inverted view of one of the nuts of FIG. 1.

Referring to FIG. 3, each nut 40 includes a round washer 42 and a protrusion 44 coaxially extending from a side of the washer 42. The diameter of the protrusion 44 is less than the diameter of the washer 42. The nut 40 axially defines a threaded hole 46 extending through the washer 42 and the protrusion 44.

Figure 4:
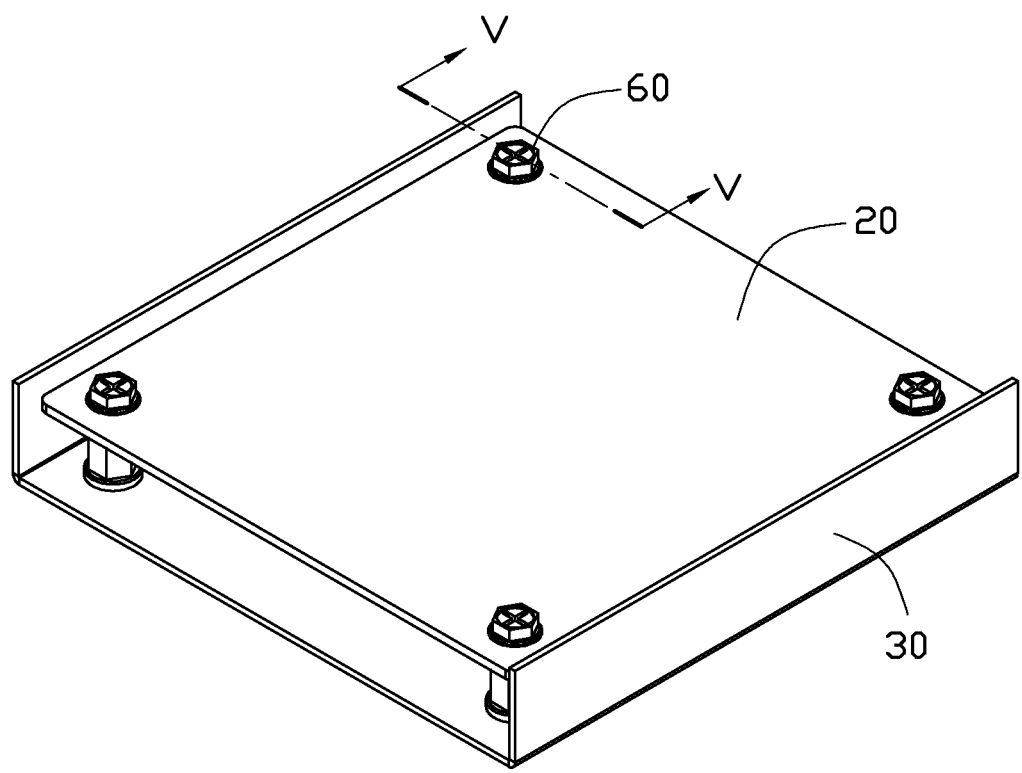
FIG. 4 is an assembled, isometric view of FIG. 1.
Figure 5:
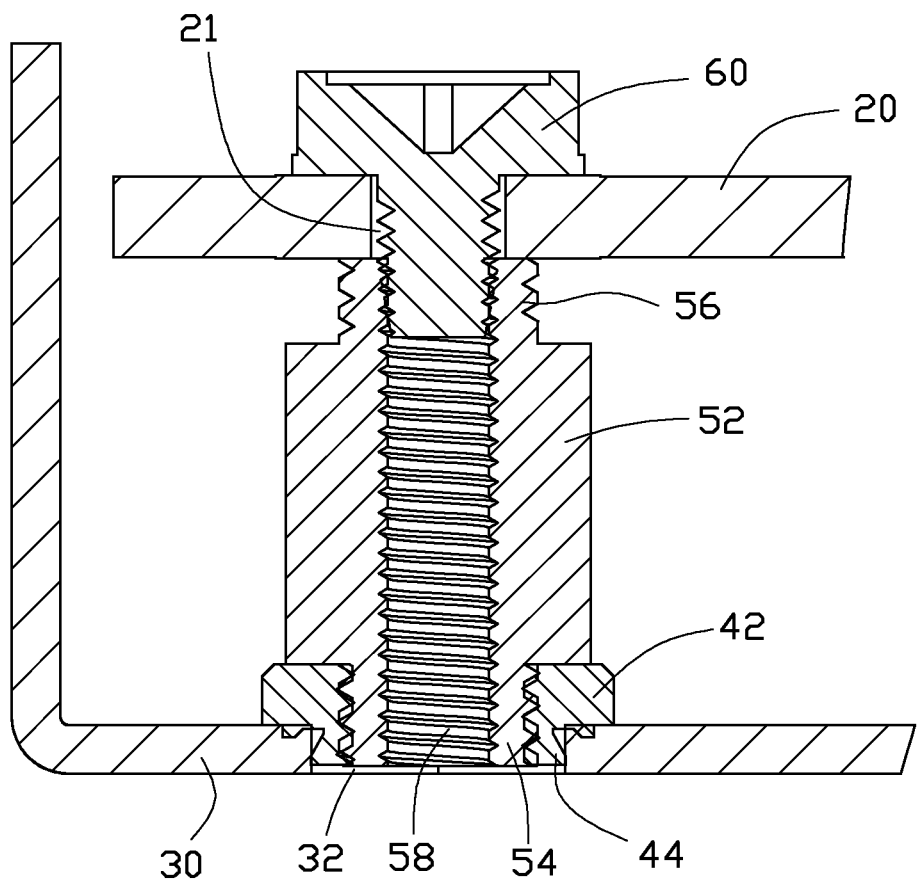
FIG. 5 is a sectional view of FIG. 4, taken along the line of V-V.

Referring to FIGS. 4 and. 5, in assembly, the nuts 40 are fixed to the base board 30, and the protrusions 44 are respectively fixed in the corresponding fixing holes 32. The washers 42 are blocked by an inner surface of the base board 30.

To fix a first circuit board 20 defining a plurality of through holes 21, the first threaded portions 54 of the posts 50 are screwed into the threaded holes 46 of the corresponding nuts 40. The circuit board 20 is supported on distal ends of the second threaded portions 56, with the through holes 21 in an alignment with the threaded holes 58. The fasteners 60 extend through the fixing holes 21, and screw into the corresponding threaded holes 58, to fix the circuit board 20 to the base board 30.

Figure 6:
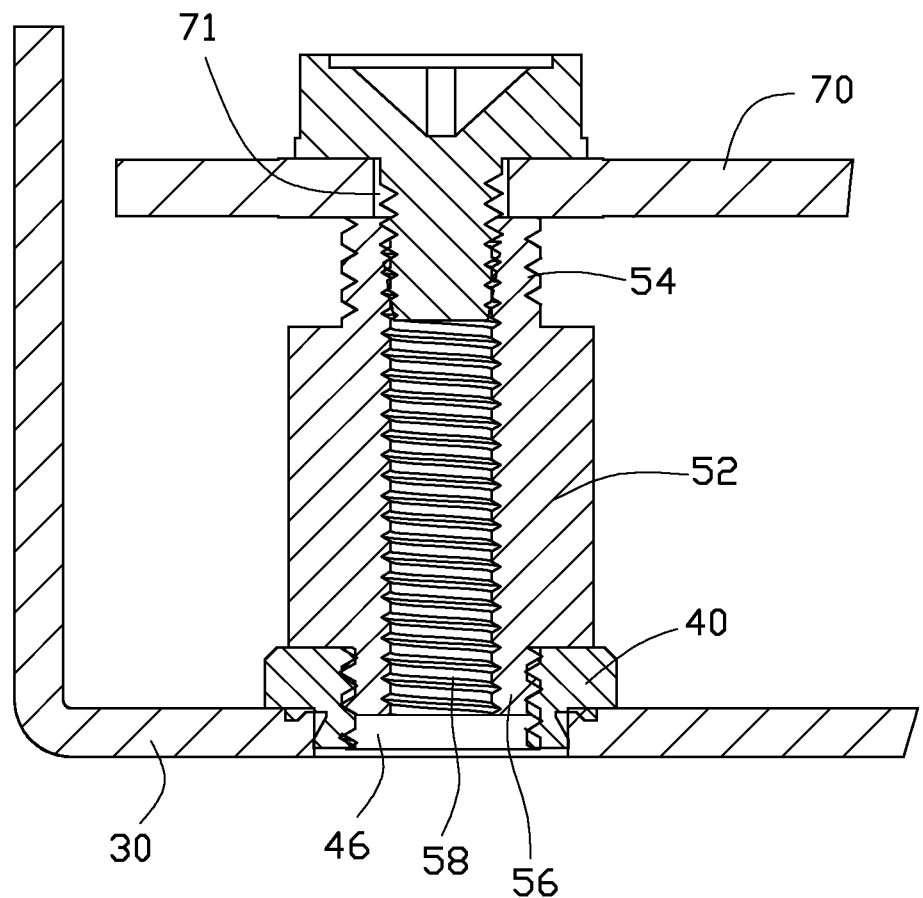
FIG. 6 is a sectional view of the fixing device of FIG. 1 fixing another circuit board.

Referring to FIG. 6, to fix a second circuit board 70 defining a plurality of through holes 71 and having less thickness than the first circuit board 20, the second threaded portions 56 are screwed into the threaded holes 46 of the corresponding nuts 40. The circuit board 70 is supported on distal ends of the first threaded portions 54, with the through holes 71 in an alignment with the threaded holes 58. The fasteners 60 extend through the through holes 71, and screw into the corresponding threaded holes 58, to fix the circuit board 70 to the base board 30, thereby maintaining a top surface of the second circuit board 70 at a constant height relative to the base board 30. The height between the top surface of the second circuit board 70 is the same as a height between a top surface of the first circuit board 20 and the base board 30.

In other embodiments, the nuts 40 may be omitted to save cost, and threads are formed on an inner wall bounding each fixing hole 32 to fix a corresponding post 50.

In other embodiments, the two threaded holes, which do not communicate with each other, are respectively defined in the first and second threaded portions 54 and 56.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiments.

What is claimed is:

1. A fixing device for circuit boards with different thickness, the fixing device comprising:
  a base board defining a fixing hole;
  a post comprising a first threaded portion and a second threaded portion to be selectively screwed in the fixing hole of the base board, a threaded hole defined in each of the first and second threaded portions, wherein the lengths of the first and the second portions are different, and a circuit board is to be supported on a distal end of one of the first and second threaded portions that is not to be screwed in the fixing hole; and a fastener to extend through the circuit board and engage in the threaded hole of said one of the first and second threaded portions that is not to be screwed in the fixing hole;

wherein the different lengths of the first and second threaded portions compensate different thicknesses of circuit boards, to maintain top surfaces of the circuit boards of different thicknesses at a same height relative to the base board.

2. The fixing device of claim 1, further comprising a nut mounted to the base board through the fixing hole, wherein the nut axially defines a threaded hole extending through opposite sides of the nut to selectively receive the first or the second threaded portion of the post.

3. The fixing device of claim 2, wherein the nut comprises a protrusion engaging in the fixing hole of the base board and a washer located above the base board, and the threaded hole of the nut extends through the washer and the protrusion.

4. The fixing device of claim 1, wherein the fastener is a screw.

5. The fixing device of claim 1, wherein the post further comprises a main body, the first and second threaded portions extend from opposite ends of the main body.

6. The fixing device of claim 5, wherein the main body is hexagon-shaped in cross section.

7. A fixing device for circuit boards with different thicknesses, comprising:

a base board defining a plurality of fixing holes;

a plurality of posts each comprising a first threaded portion and an opposite second threaded portion to be selectively screwed in a corresponding one of the plurality of fixing holes of the base board, wherein the lengths of the first and the second portions are different, and a circuit board is to be supported on distal ends of the first or second threaded portions that are not to be screwed in the fixing holes; and a plurality of fasteners, each to extend through the circuit board and engage in a corresponding one of the plurality of posts via one of the first threaded portion or the second threaded portion of the corresponding post that is not to be screwed in the corresponding fixing hole.

8. The fixing device of claim 7, further comprising a plurality of nuts, wherein each nut is mounted to the base board through a corresponding one of the plurality of fixing holes, and each nut axially defines a threaded hole extending through opposite sides of the nut to selectively receive the first or the second threaded portion of the corresponding post.

9. A fixing device comprising:

a base board defining a threaded hole;

a post comprising a main body and a first threaded portion and a second threaded portion extending from two opposite ends of the main body, the height of the first threaded portion being greater than the height of the second threaded portion, a threaded hole defined in each of the first and second threaded portions, wherein one of the first and second threaded portions is selectively threaded in the threaded hole of the base board, and a distal end of the other one of the first and second threaded portions supports a circuit board; and a fastener to extend through the circuit board and threaded in the threaded hole of the other one of the first and second threaded portions;

wherein upon a condition that the circuit board has less thickness, the first threaded portion is selected to support the circuit board, and upon a condition that the circuit board has greater thickness, the second threaded portion is selected to support the circuit board, thereby to maintain the circuit board at a constant height relative to the base board.

* * * * *